(12) United States Patent
Aram

(10) Patent No.: US 6,441,765 B1
(45) Date of Patent: Aug. 27, 2002

(54) ANALOG TO DIGITAL CONVERTER WITH ENHANCED DIFFERENTIAL NON-LINEARITY

(75) Inventor: Farbod Aram, Cupertino, CA (US)

(73) Assignee: Marvell International, Ltd., Hamilton (BM)

( * ) Notice: Subject to any disclaimer, the term of this patent is extended or adjusted under 35 U.S.C. 154(b) by 2 days.

(21) Appl. No.: 09/643,819

(22) Filed: Aug. 22, 2000

(51) Int. Cl.[7] .................................................. H03M 1/12
(52) U.S. Cl. ........................................ 341/155; 341/144
(58) Field of Search ................................ 341/155, 144, 341/161; 327/541

(56) References Cited

U.S. PATENT DOCUMENTS

| | | | | |
|---|---|---|---|---|
| 5,155,386 A | * | 10/1992 | Abdi ............................ | 307/355 |
| 5,389,928 A | * | 2/1995 | Coppero et al. ............. | 341/150 |
| 5,548,205 A | | 8/1996 | Monticelli ................... | 323/274 |
| 5,648,718 A | | 7/1997 | Edwards ..................... | 323/274 |
| 5,852,359 A | | 12/1998 | Callahan, Jr. et al. ....... | 323/274 |
| 5,909,109 A | | 6/1999 | Philips ........................ | 323/277 |
| 5,929,616 A | | 7/1999 | Perraud et al. ............. | 323/274 |
| 6,011,666 A | | 1/2000 | Wakamatsu .................. | 360/69 |
| 6,061,306 A | | 5/2000 | Buchheim et al. ............ | 369/2 |
| 6,084,387 A | | 7/2000 | Kancko et al. ............. | 323/281 |
| 6,097,326 A | * | 8/2000 | Opris et al. ................. | 341/161 |
| 6,369,554 B1 | | 9/2000 | Aram .......................... | 323/282 |

FOREIGN PATENT DOCUMENTS

| EP | 0 982 732 A1 | 8/1999 | ............ G11C/7/00 |
|---|---|---|---|
| EP | 0 999 549 A2 | 11/1999 | ........... G11B/20/10 |
| WO | PCT/US99/05734 | 3/1999 | .......... H04N/7/167 |

OTHER PUBLICATIONS

U.S. patent application Ser. No. 09/648,770, Aram et al., filed Aug. 28, 2000.
U.S. patent application Ser. No. 09/648,462, Aram et al., filed Aug. 28, 2000.
U.S. patent application Ser. No. 09/654,392, Aram, filed Sep. 1, 2000.
U.S. patent application Ser. No. 09/648,464, Aram, filed Aug. 28, 2000.
Stephen H. Lewis, "Optimizing the Stage Resolution in Pipelined, Multistage, Analog–to–Digital Converters for Video–Rate Applications", IEEE Transactions on Circuits and Systems—II: Analog and Digital Signal Processing, vol. 30, No. 8, Aug. 1992.
Stephen H. Lewis, et al., "A 10–b 20–Msample/s Analog–to–Digital Converter", IEEE Journal of Solid–State Circuits, vol. 27, No. 3, Mar. 1992, pp. 351–358.

(List continued on next page.)

Primary Examiner—Peguy JeanPierre
(74) Attorney, Agent, or Firm—Eric B. Janofsky; Katten Muchin Zavis Rosenman

(57) ABSTRACT

A bit-and-one-half analog to digital converter comprising a multiplying analog to digital converter (MDAC) operating in cooperation with a comparator which generates a two-bit digital output signal by comparison of an output of the MDAC against a pair of thresholds, wherein the thresholds are stretched outwardly from symmetrical thresholds centered at +/−¼ of the comparison range.

41 Claims, 9 Drawing Sheets

OTHER PUBLICATIONS

Stephen H. Lewis and Paul R. Gray, "A Pipelined 5-Msample/s 9-bit Analog-to-Digital Converter", IEEE Journal of Solid-State Circuits, vol. SC-22, No. 6, Dec. 1987, pp. 954-961.

Bhupendra K. Ahuja, "An Improved Frequency Compensation Technique for CMOS Operational Amplifiers", IEEE Journal of Solid-State Circuits, vol. SC-18, No. 6, Dec. 1983, pp. 629-633.

Sehat Sutardja and Paul R. Gray, "A Pipelined 13-bit, 250-ks/s, 5-V Analog-to-Digital Converter", IEEE Journal of Solid-State Circuits, vol. 23, No. 6, Dec. 1988, pp. 1316-1323.

Quantum Online / Inside Hard Disk Drives, "Part 2—A Closer Look at Hard Disk Drives"; "Chapter 3—Inside Hard Disk Drives—How They Work", Jun. 7, 2000.

Quantum Online / Recent Technological Developments, "Chapter 4—The Impact of Leading-Edge Technology on Mass Storage", Jun. 7, 2000.

Curtis Settles, "DSP-augmented CPU cores promise performance boost for ultra-compact drives", Data Storage, May 2000, pp. 35-38.

Paul C. Yu, et al., "A 2.5-V, 12-b, 5-MSample/s Pipelined CMOS ADC," IEEE Journal of Solid-State Circuits, vol. 31, No. 12, Dec. 1996, pp. 1854-1861.

Stephen H. Lewis, et al., "Indirect Testing of Digital-Correction Circuits in Analog-to-Digital Converters with Redundancy," IEEE Transactions on Circuits and Systems-II: Analog and Digital Signal Processing, vol. 42, No. 7, Jul. 1995, pp. 437-445.

* cited by examiner

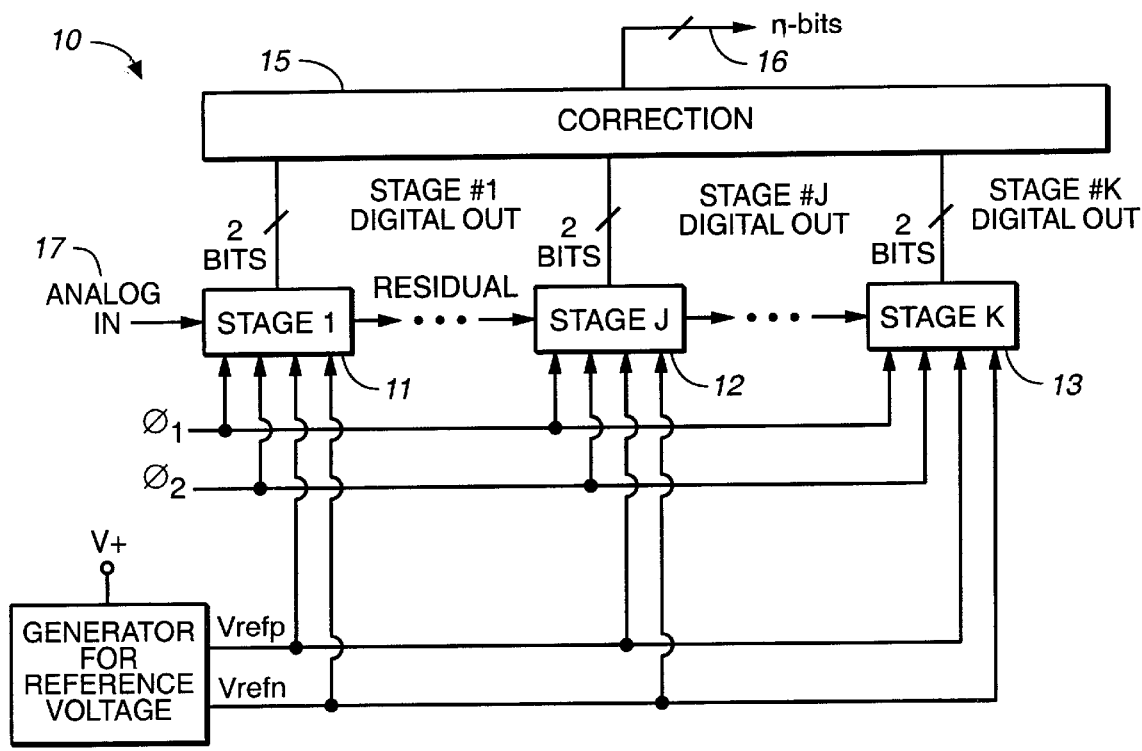
FIG._1 (PRIOR ART)
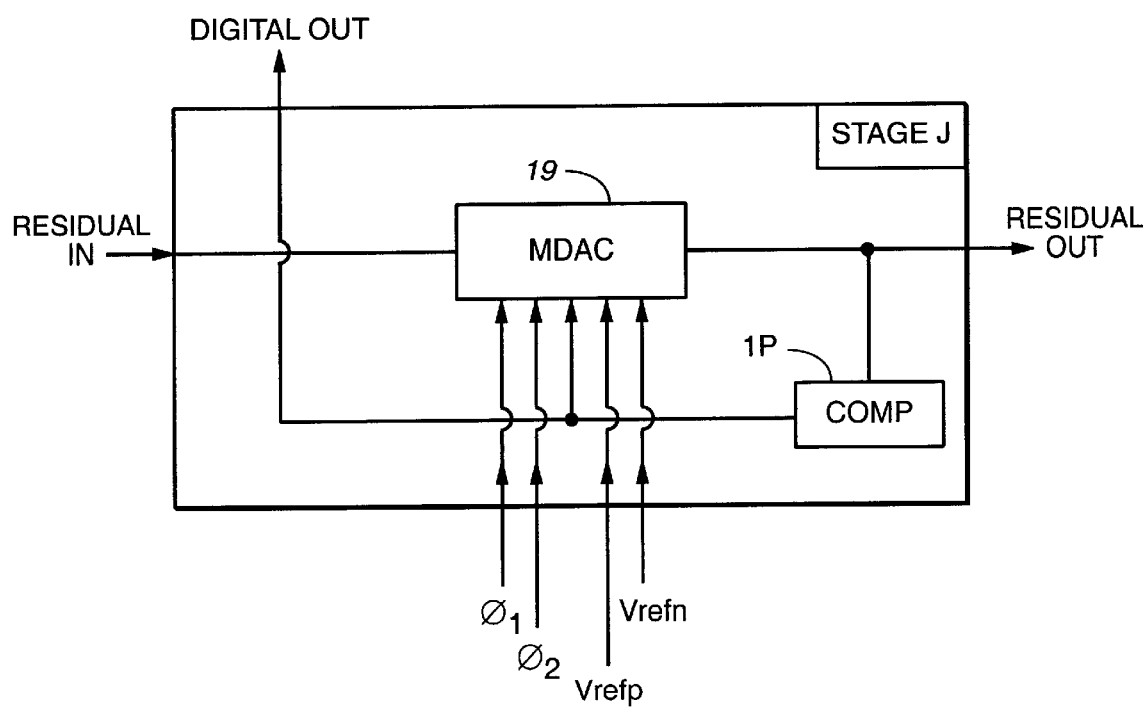
FIG._2 (PRIOR ART)

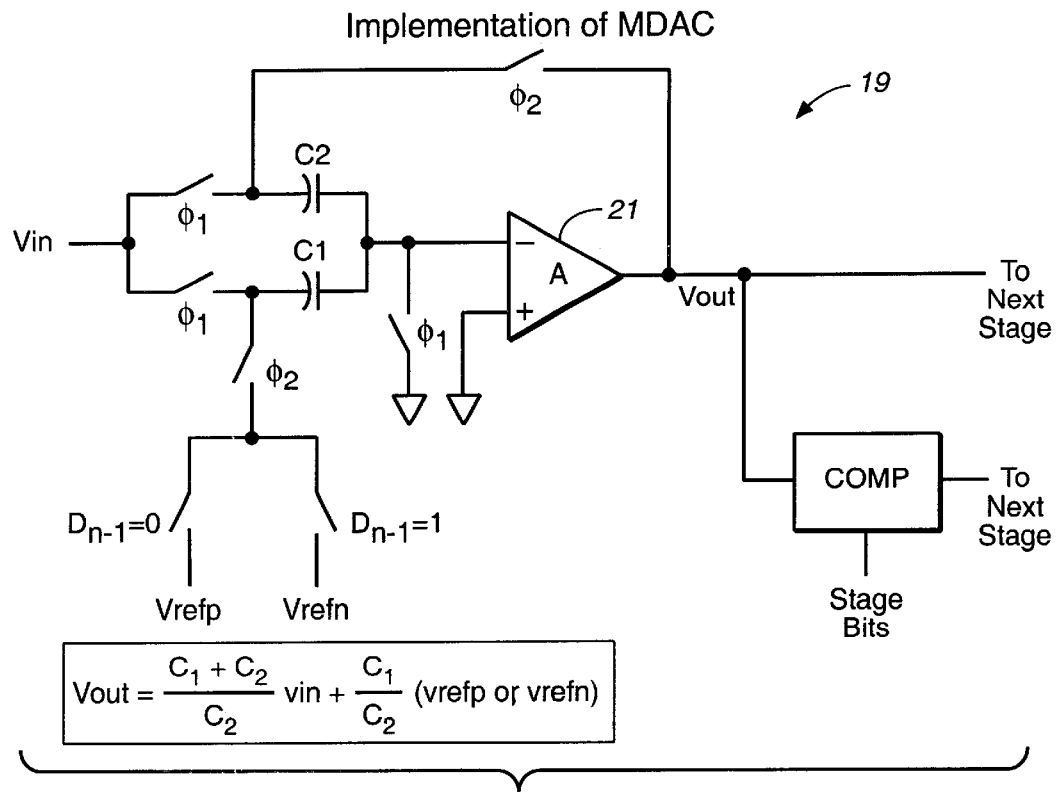
FIG._3A (PRIOR ART)
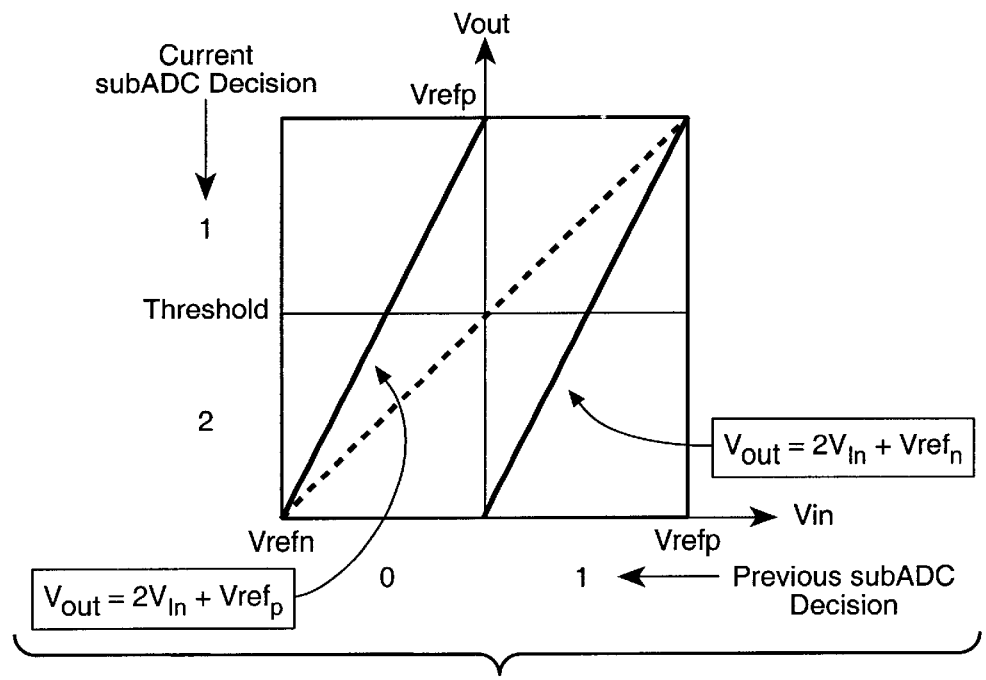
FIG._3B (PRIOR ART)

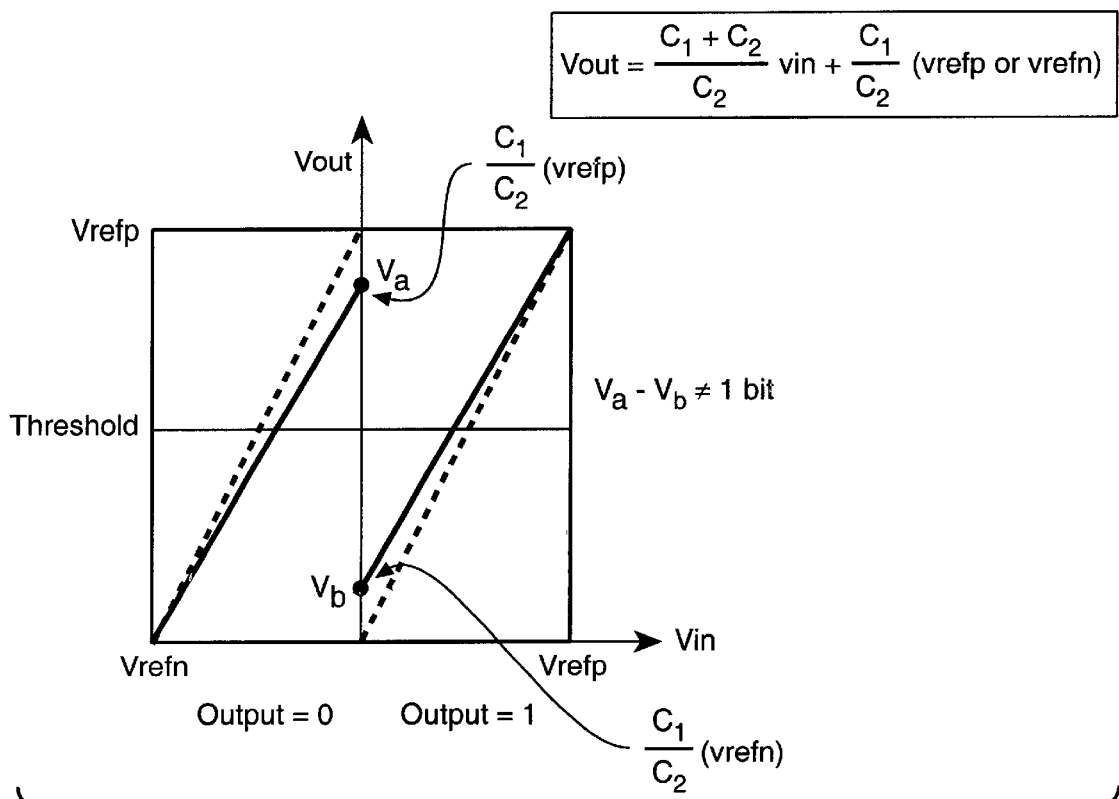
FIG._3C (PRIOR ART)
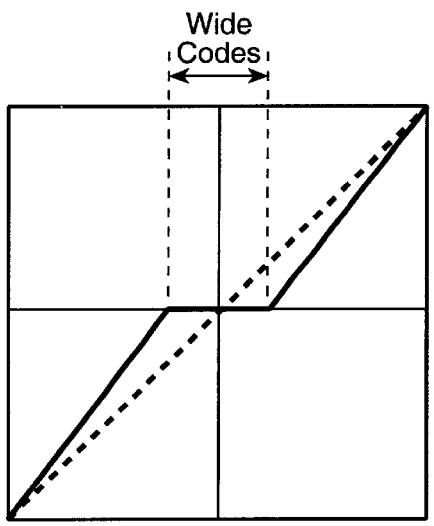
FIG._3D (PRIOR ART)

Alternating sampling and feedback capacitors
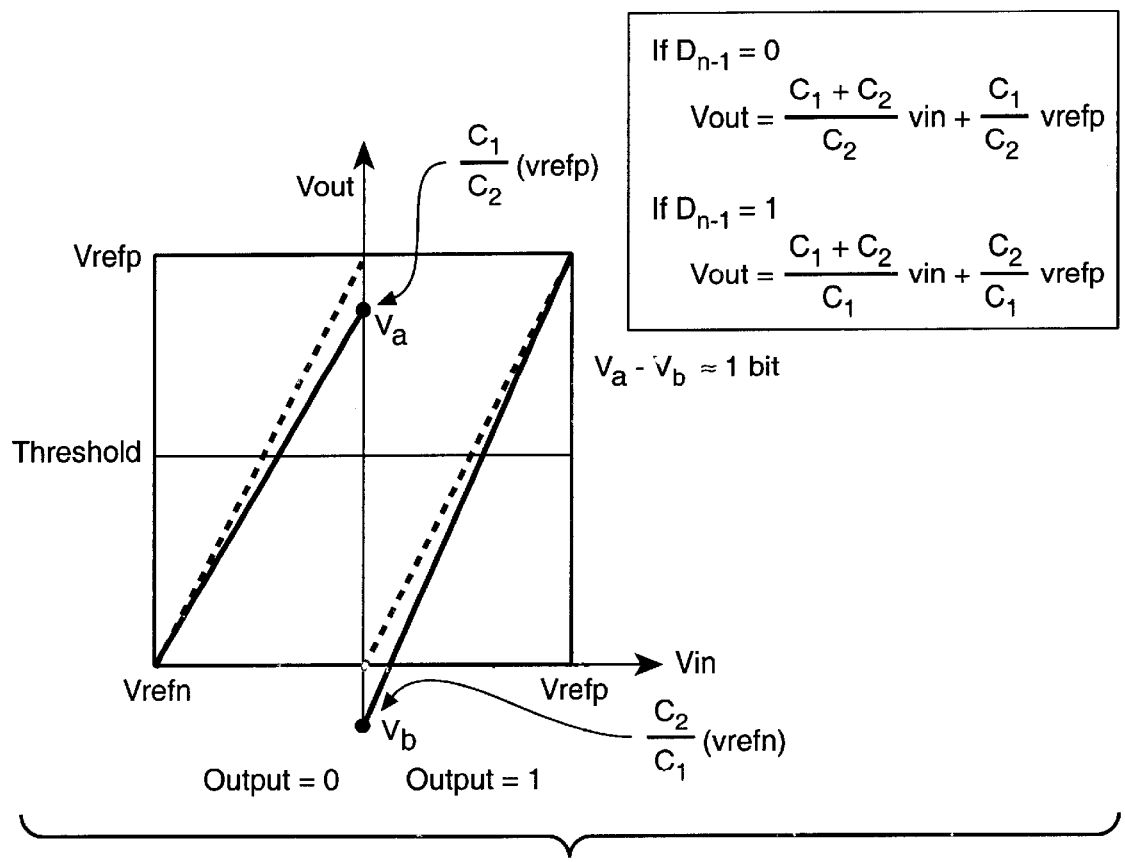
FIG._3E *(PRIOR ART)*
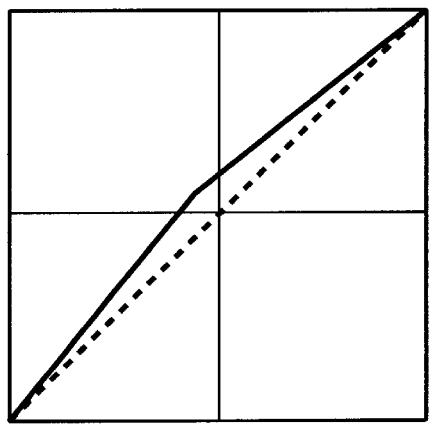
FIG._3F *(PRIOR ART)*

Offset in comparator results in DNL
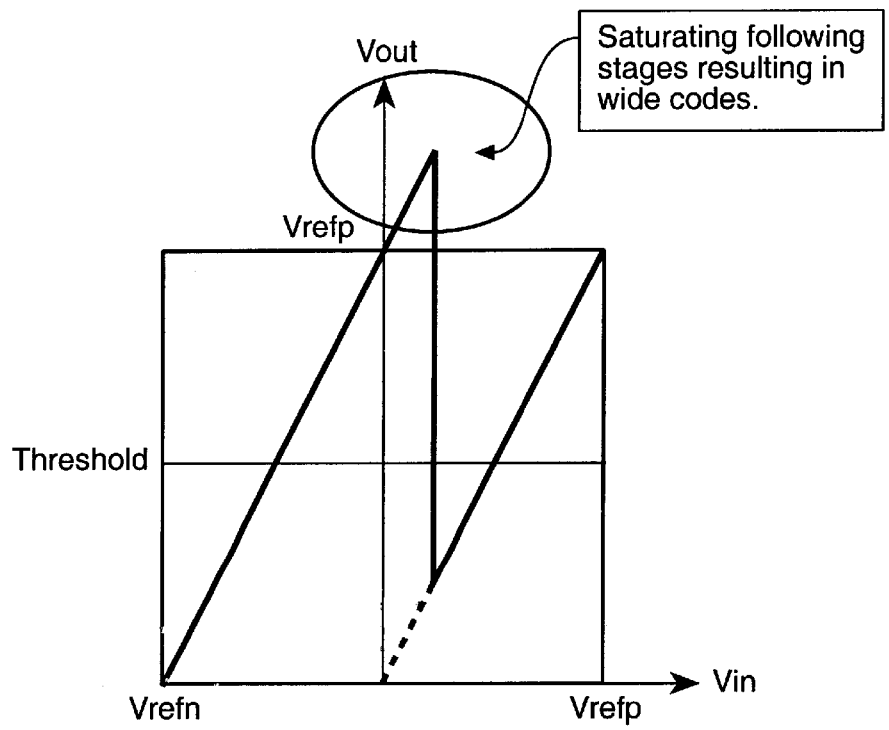
FIG._4A (PRIOR ART)
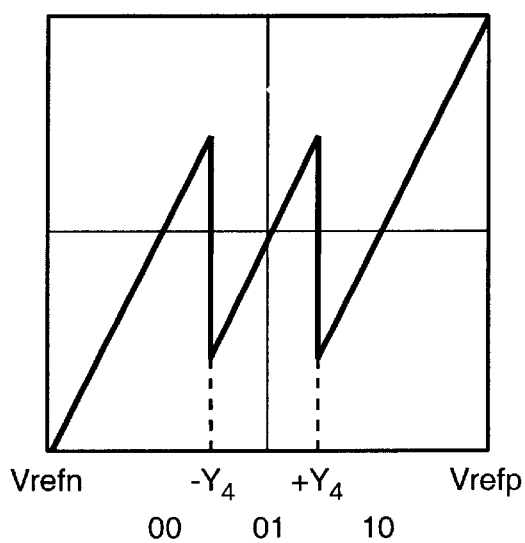
FIG._4B

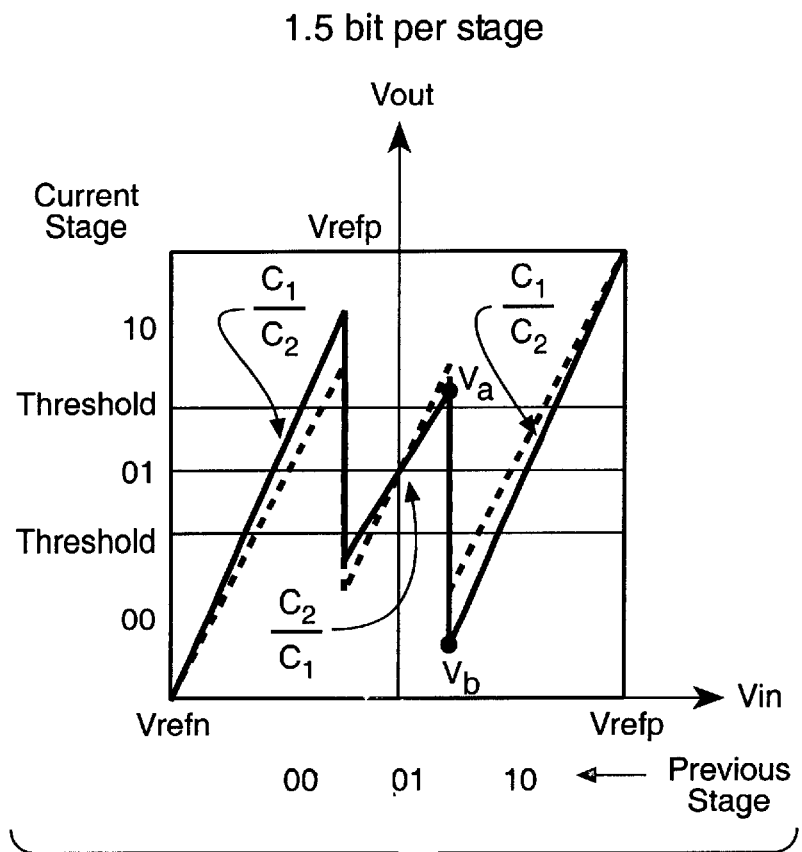
FIG._5A *(PRIOR ART)*
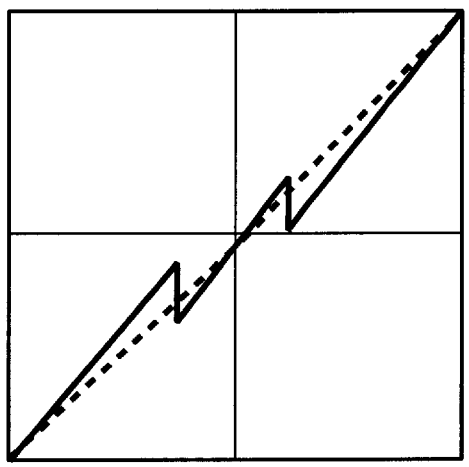
FIG._5B *(PRIOR ART)*

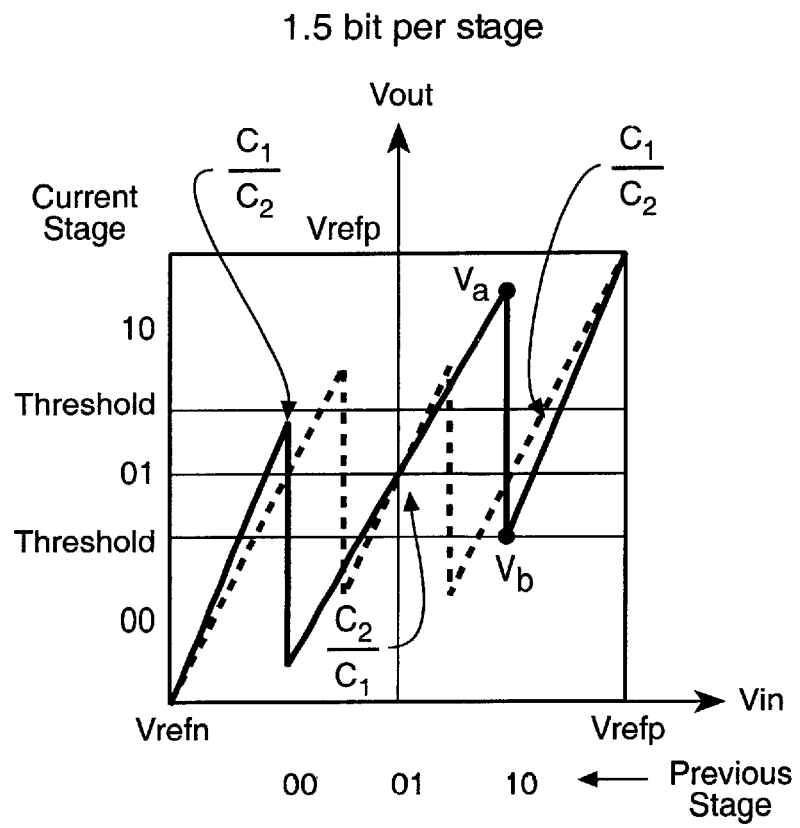
FIG._6A
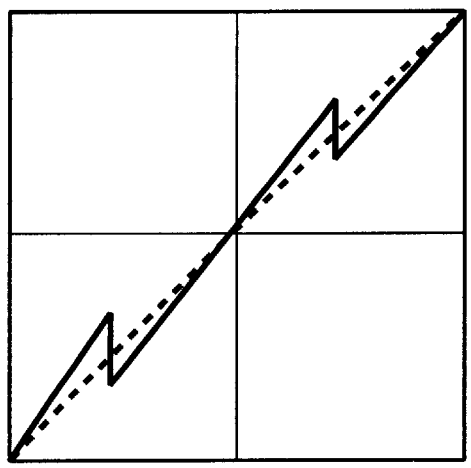
FIG._6B

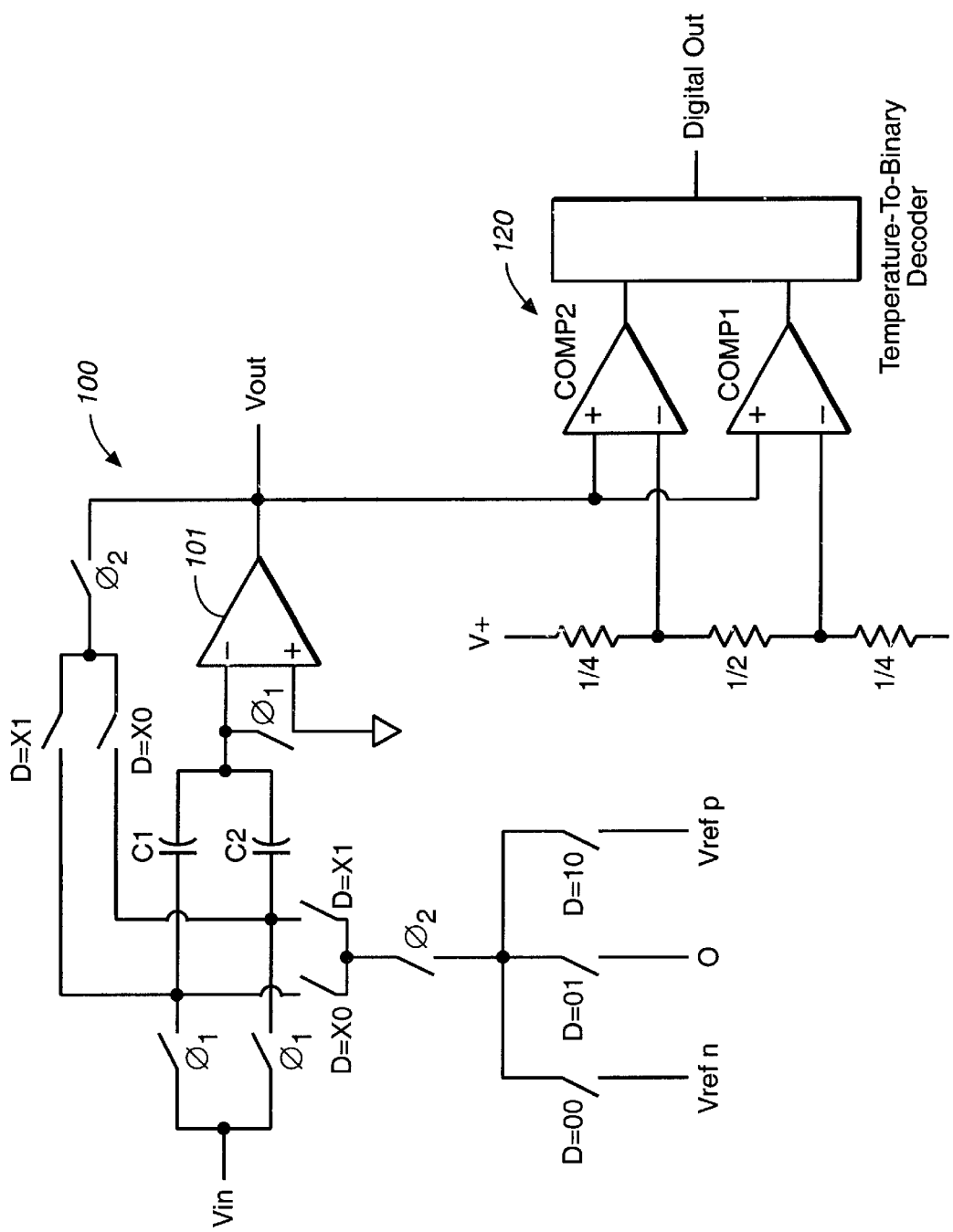
FIG._7

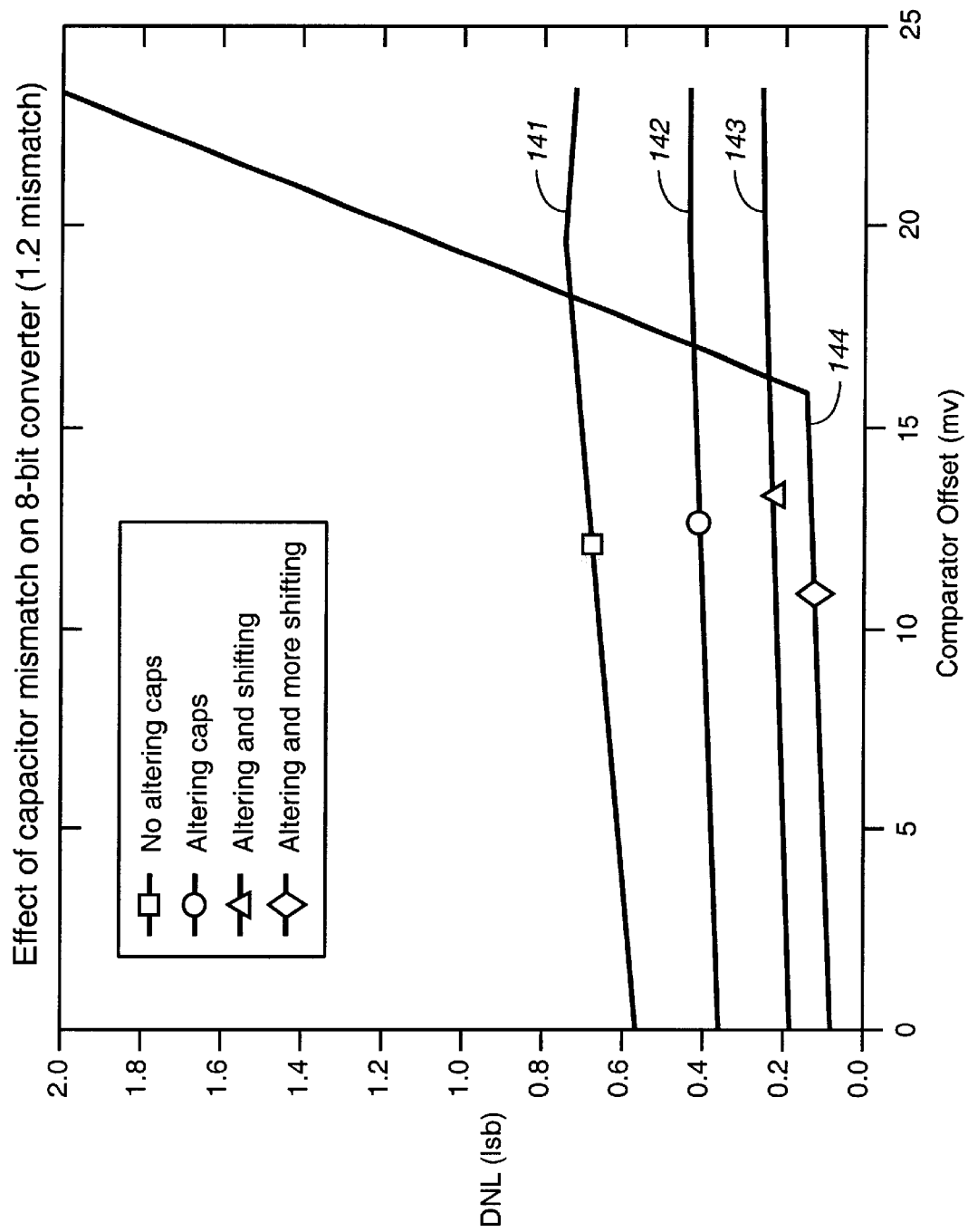
FIG._8

ANALOG TO DIGITAL CONVERTER WITH ENHANCED DIFFERENTIAL NON-LINEARITY

BACKGROUND OF THE INVENTION

1. Field of the Invention

The present invention relates to multi-stage pipelined analog to digital converters in which each stage includes a bit-and-one-half analog to digital sub-converter, and particularly relates to reductions in differential non-linearities for such an analog to digital converter.

2. Background of the Invention

Multi-stage pipelined analog to digital converters (ADC) provide efficient high speed conversion of analog signals to digital equivalents A representative multi-stage pipelined ADC 10 is shown in FIG. 1. As seen there, ADC 10 includes multiple stages such as stages 11, 12 and 13 each providing one or more bits of digital data to a digital correction circuit 15, which resolves the digital outputs from each stage into an overall digital output 16 that corresponds to an analog input 17. Each stage is a switched capacitor circuit operating in response to clock signals such as Φ1 and Φ2 and comparing an analog voltage input to thresholds based on reference signals Vrefp and Vrefn so as to produce the digital outputs as well as a residual analog signal. The residual analog signal is provided as input to the subsequent stage.

FIG. 2 is a generalized block diagram of each stage. As seen in FIG. 2, each stage applies its input analog voltage to a multiplying digital to analog converter (MDAC) 19 so as to generate its residual output analog voltage. This output voltage is provided to comparator 18 which generates the digital output. MDAC 19 uses this digital output, together with clock signal Φ1 and Φ2 and reference voltages Vrefp and Vrefn, to generate the residual output analog voltage.

FIG. 3A illustrates a typical MDAC 19. As seen there, during sample phase Φ1, an input voltage signal is sampled and stored on capacitors C1 and C2. During amplification phase Φ2, capacitor C1 is placed in the feedback leg of amplifier 21, and a voltage is applied to capacitor C2 in accordance with whether the digital output from comparator 18 is a digital 1 or a digital 0. As a consequence of this arrangement, so long as capacitors C1 and C2 are exactly equal, the output from MDAC 19 is a correctly multiplied residual voltage in dependence on the digital data generated at a stage, as shown in FIG. 3B.

Most often, however, capacitors C1 and C2 are not equal, resulting in a non-ideal slope for the digital converter, as shown in FIG. 3C. The non-ideal slope results in missing codes or wide codes. In FIG. 3C, it is assumed that C1 is slightly smaller than C2. Thus, the drop from voltage Va to Vb is slightly less than one digital bit, resulting in wide codes as shown in FIG. 3D. Of course, if C2>C1, then Va−Vb>one digital bit, resulting in unillustrated missing codes.

One solution to capacitor mismatch has been proposed by Yu, et al., "A 2.5-V, 12-b, 5-Msample/s Pipelined CMOS ADC", IEEE Journal of Solid State Circuits, Vol. 31, No. 12, p. 1854 (Dec. 1996). Yu, et al. proposed a commutated feedback-capacitor switching technique in which the role of the feedback capacitor is switched in dependence on the digital data. With the Yu, et al. technique, differential non-linearity is reduced, as seen in FIG. 3E, since the voltage drop Va−Vb is very nearly equal to one digital bit. Thus, wide codes and missing codes are avoided, and differential non-linearity is reduced as shown in FIG. 3F.

Another difficulty encountered with the multi-stage pipelined ADC shown in FIG. 1 is the problem caused by an undesired offset in comparator 18. As shown in FIG. 4A, with an undesired or uncompensated offset in comparator 18, missing codes are encountered because of a shift in the transfer function of MDAC 19. One solution proposed for this difficulty is the provision of multiple bits from each stage as already described. The bits are generated by comparison with thresholds which are +/−¼ of the comparison range centered symmetrically around zero. With multiple bits for each stage, a transfer function such as in FIG. 4B is obtained, in which two bits of digital output are obtained for each stage, and the digital outputs of all stages are resolved by correction circuitry 15 so as to result in the overall ADC output. The arrangement shown in FIG. 4D is often referred to as a "bit-and-one-half converter".

Combining the techniques of bit-and-one-half converters with the Yu, et al. technique of commutated feedback-capacitor switching is expected to yield a highly efficient pipelined ADC with good differential non-linearity. However, one source of differential non-linearity remains, as follows.

Specifically, commutated feedback-capacitor switching works in single-bit MDACs because the voltage drop from the voltage Va to Vb is approximately equal to one bit. However, in bit-and-a-half MDACs, when capacitive mismatch is present, the voltage drop from Va to Vb is not equal to one bit as seen in FIG. 5A, resulting in differential non-linearity shown in FIG. 5B. Thus, commutated feedback-capacitor switching in bit-and-a-half MDACs only reduces differential non-linearity by about 50%, primarily because of unequal threshold spacing between the 00 and 01 decision point and between the 01 and 11 decision point.

SUMMARY OF THE INVENTION

It is an object of the present invention to reduce differential non-linearity in bit-and-one-half analog to digital converter by threshold-stretching the threshold at which each stage of the bit-and-one-half converter operates.

In more detail, FIG. 6A is a graph showing input versus output for one stage of a multi-stage bit-and-one-half ADC. As seen there, the threshold for conversion has been shifted outwardly relative to the threshold shown in the conventional arrangement of FIG. 5A. As a result, the voltage drop from Va to Vb is much closer to the desired one bit at which commutated feedback-capacitive switching operates most ideally, yielding an overall transfer curve shown in FIG. 6B in which differential non-linearity, though still present, is reduced relative to the conventional arrangement shown in FIG. 5B.

Thus, in one aspect the invention is a bit-and-one-half conversion stage for a multi-stage pipelined ADC in which conversion thresholds are stretched outwardly relatively to corresponding thresholds in conventional conversion stages. Shifting outwardly too much completely destroys the effectiveness of bit-and-one-half conversion such that when the thresholds are shifted completely to the edge of positive and negative reference voltages divided by two (i.e., Vrefn/2 and Vrefp/2), the benefits of bit-and-one-half conversion are eliminated. An intermediate shift is therefore preferable; the inventor herein has determined that for a 1% mismatch in capacitance, a preferred shift is a shift outwardly of approximately 0.125 (normalized to +1 and −1 reference voltages) from conventional threshold locations of +/−¼.

Also, with reference to FIG. 6A, by shifting the positive threshold to the right by approximately Vrefp/8, and by shifting the negative threshold to the left by approximately Vrefn/8, a desired drop in residue can be achieved. The entire residue is preferably located inside the window (e.g., the box) shown in FIG. 6A. However, when using the entire capability of error correction logic to compensate for capacitor mismatch, op-amp and comparator offset (plus charge injection) may cause differential non-linearity noise.

The shift in threshold can be obtained by a variety of techniques, including simple resistive ladders, internal generation of reference voltages, or converter-wide reliance on globally-generated thresholds.

In another aspect, the invention is a multistage pipelined ADC using the aforementioned bit-and-one-half converter with outwardly stretched conversion thresholds.

This brief summary has been provided so that the nature of the invention may be understood quickly. A more complete understanding of the invention can be obtained by reference to the following detailed description of the preferred embodiment thereof in connection with the attached drawings.

BRIEF DESCRIPTION OF THE DRAWINGS

FIGS. 1 and 2 are functional block diagrams showing a conventional multi-stage pipelined ADC.

FIGS. 3A through 3F are views for explaining differential non-linearity caused by a multiplying digital to analog converter in individual stages.

FIGS. 4A and 4B are views for explaining a conventional bit-and-one-half converter stage for a multi-stage ADC.

FIGS. 5A and 5B are views for explaining differential non-linearity in a conventional bit-and-one-half converter stage.

FIGS. 6A and 6B are views for explaining reduced differential non-linearity in a bit-and-one-half converter according to the invention.

FIG. 7 is a detailed diagram showing a bit-and-one-half converter according to the invention in which thresholds have been shifted outwardly.

FIG. 8 is a graph showing the effectiveness of the present invention in reducing differential non-linearity.

DETAILED DESCRIPTION OF THE PREFERRED EMBODIMENT

As shown in FIG. 7, each stage of a multistage bit-and-one-half ADC includes a switched capacitor MDAC 100 operating in cooperation with a stretched-threshold comparator 120. The MDAC 100 includes a pair of capacitors C1 and C2 which operate in a sampling phase Φ1 and an amplification phase Φ2, with the role of the feedback capacitor being switched in accordance with the digital output data from comparator 120. Thus, as shown in FIG. 7, capacitors C1 and C2 charge to an input voltage during sampling phase Φ1. Then, during amplifying phase Φ2, one of capacitors C1 and C2 is placed in the feedback loop for amplifier 101, and the other is fed a bias voltage. The selection of which capacitor is in the feedback loop and which is fed a bias voltage depends on the digital output of comparator 120. Thus, if the digital output indicates operation in center section corresponding to digital output 01, then capacitor C1 is in the feedback loop to amplifier 101, whereas capacitor C2 is fed a bias voltage. Conversely, if the digital output from comparator 120 signifies operation in the outermost regions corresponding to digital output 00 or 10, then capacitor C2 is in the feedback loop and capacitor C1 is fed the bias voltage.

The bias voltage fed to the selected capacitor depends on the digital output from comparator 120. As illustrated in FIG. 7, if the digital output signifies operation in left-most region corresponding to digital output 00, then the selected capacitor is biased by a voltage corresponding to Vrefn. If the digital output signifies operation in center-most region corresponding to digital output 01, then the selected capacitor is biased by a voltage of zero. If the digital output signifies operation in right-most region corresponding to digital output 10, then the selected capacitor is biased by a voltage corresponding to Vrefp.

The output of MDAC 100 is provided to comparator 120 which consists of two comparators COMP1 and COMP2. Thresholds for the comparators are set at thresholds stretched relatively to conventional bit-and-one-half converters. As shown in FIG. 7, the threshold for comparator COMP1 is set at one-quarter from the lower-most range Vrefp and Vrefn, whereas the threshold for comparator COMP2 is set at one-quarter from the uppermost range of Vrefn and Vrefp. Thus, operation in the central section corresponds to one-half of the overall range from Vrefp to Vrefn, thereby resulting in thresholds stretched relative to the thresholds of conventional bit-and-one-half converters.

Although FIG. 7 illustrates thresholds set by virtue of a resistive ladder, other techniques for setting thresholds may be utilized. In particular, thresholds may be set buy globally-generated thresholds for use by all stages of the multi-stage ADC, and thresholds may also be set by voltage generation circuitry specifically tailored to produce desired thresholds.

The amount of shift depends on the anticipated capacitive mismatch between capacitors C1 and C2, and further depends on the desired amount of reduction in differential non-linearity. FIG. 8 shows differential non-linearity as a function of comparator offset, and compares differential non-linearity for various shifts with that for conventional circuitry. A first line 141 shows differential non-linearity that results when commutative feedback-capacitor switching is not used, and line 142 shows differential non-linearity when commutative feedback-capacitor switching is utilized, both for capacitive mismatches of 1.2%. As shown at line 143, additional reduction in differential non-linearity can be obtained in accordance with the invention by stretching thresholds outwardly from their nominal value (i.e., +/−¼ of the comparator range centered symmetrically around zero) by about +/−0.125. An additional decrease in differential non-linearity can be obtained by further stretching of threshold by about +/−0.175. As shown in the graph of 144, however, a point of diminishing returns occurs since other errors begin to affect operation and can affect operation catastrophically. The inventor herein has found that with an anticipated capacitive mismatch of 1%, good reduction in differential non-linearity can be obtained when both thresholds are stretched outwardly from their nominal values (which are +/−¼ of the comparator range centered symmetrically around zero) by an amount equal to 0.125 of the normalized range.

The invention has been described with respect to particular illustrative embodiments. It is to be understood that the invention is not limited to the above-described embodiments and that various changes and modifications may be made by those of ordinary skill in the art without departing from the spirit and scope of the invention.

What is claimed is:

1. A bit-and-one-half analog to digital converter comprising a multiplying analog to digital converter operating in cooperation with a comparator which generates a digital output signal by comparison of an output of said multiplying analog to digital converter against a pair of thresholds, wherein said thresholds are stretched outwardly from symmetrical thresholds centered at +/−¼ of the comparison range.

2. A bit-and-one-half analog to digital converter according to claim 1, wherein each of the thresholds is stretched outwardly by ⅛ of the comparison range.

3. A bit-and-one-half analog to digital converter according to claim 1, wherein said comparator generates a two-bit digital output.

4. A bit-and-one-half analog to digital converter comprising:
   a switched capacitive sample and amplification circuit that accepts an analog input voltage and generates a multiplied analog output voltage; and
   a comparator which generates a digital output based on the analog output voltage generated by said switched capacitive sample and amplification circuit;
   wherein said switched capacitive sample and amplification circuit samples the analog input voltage during a first sampling phase in which the voltage is stored on a pair of switched capacitors, and generates the amplified analog output voltage during a second amplification phase in which one of the capacitors is switched into a feedback amplification circuit in dependence on the digital output from said comparator and in which the other capacitor is biased with a reference voltage also selected in dependence on the digital output; and
   wherein said comparator generates the digital output by comparison of the generated analog output voltage against a pair of thresholds, said thresholds being stretched outwardly from symmetrical thresholds centered at +/−¼ of the comparison range.

5. A bit-and-one-half analog to digital converter according to claim 4, wherein said thresholds are each stretched outwardly by ⅛ of the comparison range.

6. A bit-and-and-one-half analog to digital converter according to claim 4, further comprising a resistor ladder for generating the thresholds.

7. A bit-and-one-half analog to digital converter according to claim 6, wherein said resistive ladder generates a first threshold spaced ¼ of the comparison range from a most negative comparison voltage, and a second threshold spaced ¼ of the comparison range from a most positive comparison voltage.

8. A bit-and-one-half analog to digital converter according to claim 6, wherein said comparator generates a two-bit digital output.

9. A multi-stage pipelined analog to digital converter comprising:
   plural stages arranged in series relative to each other, each stage accepting an input analog voltage and generating a residual analog voltage together with a digital output; and
   a correction circuit for accepting the digital output from each of said plural stages and for generating a digital output in correspondence to an analog input voltage;
   wherein each stage comprises a switched capacitive sample and amplification circuit that accepts an analog input voltage and generates a multiplied analog output voltage and a comparator which generates a digital output based on the analog output voltage generated by said switched capacitive sample and amplification circuit;
   wherein said switched capacitive sample and amplification circuit samples the analog input voltage during a first sampling phase in which the voltage is stored on a pair of switched capacitors, and generates the amplified analog output voltage during a second amplification phase in which one of the capacitors is switched into a feedback amplification circuit in dependence on the digital output from said comparator and in which the other capacitor is biased with a reference voltage also selected in dependence on the digital output; and
   wherein said comparator generates the digital output by comparison of the generated analog output voltage against a pair of thresholds, said thresholds being stretched outwardly from symmetrical thresholds centered at +/−¼ of the comparison range.

10. A multi-stage pipelined analog to digital converter according to claim 9, wherein said thresholds are each stretched outwardly by ⅛ of the comparison range.

11. A multi-stage pipelined analog to digital converter according to claim 9, further comprising a resistor ladder for generating the thresholds.

12. A multi-stage pipelined analog to digital converter according to claim 11, wherein said resistive ladder generates a first threshold spaced ¼ of the comparison range from a most negative comparison voltage, and a second threshold spaced ¼ of the comparison range from a most positive comparison voltage.

13. A multi-stage pipelined analog to digital converter according to claim 9, wherein said comparator generates a two-bit digital output.

14. A bit-and-one-half analog to digital converter comprising multiplying analog to digital converter (multiplying analog to digital converter ) means for operating in cooperation with comparator means for generating a digital output signal by comparison of an output of said multiplying analog to digital converter means against a pair of thresholds, wherein said thresholds are stretched outwardly from symmetrical thresholds centered at +/−¼ of the comparison range.

15. A bit-and-one-half analog to digital converter according to claim 14, wherein each of the thresholds is stretched outwardly by ⅛ of the comparison range.

16. A bit-and-one-half analog to digital converter according to claim 14, wherein said comparator means generates a two-bit digital output.

17. A bit-and-one-half analog to digital converter comprising:
   switched capacitive sample and amplification circuit means for accepting an analog input voltage and for generating a multiplied analog output voltage; and
   comparator means for generating a digital output based on the analog output voltage generated by said switched capacitive sample and amplification circuit means;
   wherein said switched capacitive sample and amplification circuit means samples the analog input voltage during a first sampling phase in which the voltage is stored on a pair of switched capacitors, and generates the amplified analog output voltage during a second amplification phase in which one of the capacitors is switched into a feedback amplification circuit in dependence on the digital output from said comparator means and in which the other capacitor is biased with a reference voltage also selected in dependence on the digital output; and
   wherein said comparator means generates the digital output by comparison of the generated analog output voltage against a pair of thresholds, said thresholds being stretched outwardly from symmetrical thresholds centered at +/−¼ of the comparison range.

18. A bit-and-one-half analog to digital converter according to claim 17, wherein said thresholds are each stretched outwardly by ⅛ of the comparison range.

19. A bit-and-one-half analog to digital converter according to claim 17, further comprising resistor ladder means for generating the thresholds.

20. A bit-and-one-half analog to digital converter according to claim 19, wherein said resistive ladder means generates a first threshold spaced ¼ of the comparison range from a most negative comparison voltage, and a second threshold spaced ¼ of the comparison range from a most positive comparison voltage.

21. A bit-and-one-half analog to digital converter according to claim 19, wherein said comparator means generates a two-bit digital output.

22. A multi-stage pipelined analog to digital converter comprising;

plural stage means arranged in series relative to each other, each stage means for accepting an input analog voltage and for generating a residual analog voltage together with a digital output; and correction circuit means for accepting the digital output from each of said plural stage means and for generating a digital output in correspondence to an analog input voltage;

wherein each stage means comprises a switched capacitive sample and amplification circuit means for accepting an analog input voltage and for generating a multiplied analog output voltage and a comparator means for generating a digital output based on the analog output voltage generated by said switched capacitive sample and amplification circuit means;

wherein said switched capacitive sample and amplification circuit means samples the analog input voltage during a first sampling phase in which the voltage is stored on a pair of switched capacitors, and generates the amplified analog output voltage during a second amplification phase in which one of the capacitors is switched into a feedback amplification circuit in dependence on the digital output from said comparator means and in which the other capacitor is biased with a reference voltage also selected in dependence on the digital output; and wherein said comparator means generates the digital output by comparison of the generated analog output voltage against a pair of thresholds, said thresholds being stretched outwardly from symmetrical thresholds centered at +/−¼ of the comparison range.

23. A multi-stage pipelined analog to digital converter according to claim 22, wherein said thresholds are each stretched outwardly by ⅛ of the comparison range.

24. A multi-stage pipelined analog to digital converter according to claim 22, further comprising resistor ladder means for generating the thresholds.

25. A multi-stage pipelined analog to digital converter according to claim 24, wherein said resistive ladder means generates a first threshold spaced ¼ of the comparison range from a most negative comparison voltage, and a second threshold spaced ¼ of the comparison range from a most positive comparison voltage.

26. A multi-stage pipelined analog to digital converter according to claim 22, wherein said comparator means generates a two-bit digital output.

27. A bit-and-one-half analog to digital converter comprising:

a switched capacitive sample and amplification circuit that accepts an analog input voltage and generates a multiplied analog output voltage; and a comparator which generates a digital output based on the analog output voltage generated by said switched capacitive sample and amplification circuit;

wherein said switched capacitive sample and amplification circuit samples the analog input voltage during a first sampling phase in which the voltage is stored on a plurality of capacitors, and generates the amplified analog output voltage during a second amplification phase in which at least one of the plurality of capacitors is switched into a feedback amplification circuit in dependence on the digital output from said comparator and in which at least another one of the capacitors is biased with a reference voltage; and wherein said comparator generates the digital output by comparison of the generated analog output voltage against a plurality of thresholds.

28. A bit-and-one-half analog to digital converter according to claim 27, wherein the reference voltage also selected in dependence on the digital output.

29. A bit-and-one-half analog to digital converter according to claim 27, wherein said plurality of thresholds are stretched outwardly from symmetrical thresholds centered at +/−¼ of the comparison range.

30. A multi-stage pipelined analog to digital converter comprising:

plural stages arranged in series relative to each other, each stage accepting an input analog voltage and generating a residual analog voltage together with a digital output; and a correction circuit for accepting the digital output from each of said plural stages and for generating a digital output in correspondence to an analog input voltage;

wherein each stage comprises a switched capacitive sample and amplification circuit that accepts an analog input voltage and generates a multiplied analog output voltage and a comparator which generates a digital output based on the analog output voltage generated by said switched capacitive sample and amplification circuit;

wherein said switched capacitive sample and amplification circuit samples the analog input voltage during a first sampling phase in which the voltage is stored on a plurality of capacitors, and generates the amplified analog output voltage during a second amplification phase in which at least one of the plurality of capacitors is switched into a feedback amplification circuit in dependence on the digital output from said comparator and in which at least another one of the capacitors is biased with a reference voltage; and wherein said comparator generates the digital output by comparison of the generated analog output voltage against a plurality of thresholds.

31. A multi-stage pipelined analog to digital converter according to claim 30, wherein the reference voltage also selected in dependence on the digital output.

32. A multi-stage pipelined analog to digital converter according to claim 30, wherein said plurality of thresholds are stretched outwardly from symmetrical thresholds centered at +/−¼ of the comparison range.

33. A bit-and-one-half analog to digital converter comprising:

switched capacitive sample and amplification circuit means for accepting an analog input voltage and for generating a multiplied analog output voltage; and comparator means for generating a digital output based on the analog output voltage generated by said switched capacitive sample and amplification circuit means;

wherein said switched capacitive sample and amplification circuit means samples the analog input voltage during a first sampling phase in which the voltage is stored on a plurality of capacitors, and generates the amplified analog output voltage during a second amplification phase in which at least one of the plurality of capacitors is switched into a feedback amplification circuit in dependence on the digital output from said comparator means and in which at least another one of the capacitors is biased with a reference voltage; and wherein said comparator means generates the digital output by comparison of the generated analog output voltage against a plurality of thresholds.

34. A bit-and-one-half analog to digital converter according to claim 33, wherein the reference voltage also selected in dependence on the digital output.

35. A bit-and-one-half analog to digital converter according to claim 33, wherein said plurality of thresholds are stretched outwardly from symmetrical thresholds centered at +/−¼ of the comparison range.

36. A multi-stage pipelined analog to digital converter comprising:

plural stage means arranged in series relative to each other, each stage means for accepting an input analog voltage and for generating a residual analog voltage together with a digital output; and correction circuit means for accepting the digital output from each of said plural stage means and for generating a digital output in correspondence to an analog input voltage;

wherein each stage means comprises a switched capacitive sample and amplification circuit means for accepting an analog input voltage and for generating a multiplied analog output voltage and a comparator means for generating a digital output based on the analog output voltage generated by said switched capacitive sample and amplification circuit means;

wherein said switched capacitive sample and amplification circuit means samples the analog input voltage during a first sampling phase in which the voltage is stored on a plurality of capacitors, and generates the amplified analog output voltage during a second amplification phase in which at least one of the plurality of capacitors is switched into a feedback amplification circuit in dependence on the digital output from said comparator means and in which at least another one of said capacitors is biased with a reference voltage; and wherein said comparator means generates the digital output by comparison of the generated analog output voltage against a plurality of thresholds.

37. A multi-stage pipelined analog to digital converter according to claim 36, wherein the reference voltage also selected in dependence on the digital output.

38. A multi-stage pipelined analog to digital converter according to claim 36, wherein said plurality of thresholds are stretched outwardly from symmetrical thresholds centered at +/−¼ of the comparison range.

39. A method of converting an analog signal into a digital signal, comprising the steps of:

(a) sampling an analog input during a sampling phase;

(b) storing the analog input in a plurality of capacitors;

(c) generating an amplified analog output voltage during an amplifying phase;

(d) comparing the amplified analog output voltage with a plurality of threshold voltages;

(e) switching at least one of the plurality of capacitors into a feedback arrangement in accordance with step (d); and (f) biasing at least another one of the plurality of capacitors with a reference voltage.

40. A method according to claim 39, wherein step (f) comprises selecting the reference voltage in accordance with step (d).

41. A method according to claim 39, wherein step (d) comprises the step of stretching the plurality of thresholds outwardly from symmetrical thresholds centered at +/−¼ of the comparison range.

* * * * *